(12) United States Patent
Kamishima

(10) Patent No.: US 6,236,686 B1
(45) Date of Patent: May 22, 2001

(54) DATA PROCESSING EQUIPMENT AND METHOD

(75) Inventor: Yoshiyuki Kamishima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/030,938

(22) Filed: Feb. 26, 1998

(30) Foreign Application Priority Data

Feb. 27, 1997 (JP) .................................................. 9-044033

(51) Int. Cl.$^7$ ........................... H04L 25/06; H04L 25/00; H03M 5/00
(52) U.S. Cl. ............................. 375/295; 375/296; 341/58
(58) Field of Search ..................................... 375/296, 295, 375/377, 284, 285; 341/50, 51, 52, 58, 59, 173

(56) References Cited

U.S. PATENT DOCUMENTS 5,644,601 * 7/1997 Kawaguchi ........................... 375/295
6,008,744 * 12/1999 Kamishima ........................... 341/58

* cited by examiner

Primary Examiner—Stephen Chin
Assistant Examiner—Betsy L. Deppe
(74) Attorney, Agent, or Firm—Scully, Scott, Murphy & Presser

(57) ABSTRACT

Disclosed is a data processing equipment for conducting the whitener encoding to suppress DC bias in transmit data in a communication device, which has: a multiplexer which parallel-to-serial-converts transmit data and a scrambler which randomizes the converted data; a first counter which counts by +3, +1, −1 or −3 when 2-bit symbol data in the data concerned have a logical level of '10', '11', '01' or '00'; a second counter which counts by +3, +1, −1 or −3 when the 2-bit symbol data in all data to be already transmitted have a logical level of '10', '11', '01' or '00'; a way to compare a sign bit (MSB of counted weight value) of the first counter with a sign bit (MSB of counted weight value) the second counter; two bit-inversion circuits which invert between '1' and '0' of the data according to the comparison result of the comparing means; two n/2-bit shift registers which delay by n-bit data concerned; and two bit-stuff circuits which insert two-bit stuff bit to the delayed n-bit data supplied from the two n/2-bit shift registers and output the stuff-bit-inserted n-bit data to the two bit-inversion circuits.

6 Claims, 10 Drawing Sheets

DATA PROCESSING EQUIPMENT AND METHOD

FIELD OF THE INVENTION

This invention relates to data processing equipment and a data processing method, and more particularly to, data processing equipment and a data processing method for conducting the whitener encoding used to suppress a DC bias in transmitted data in a wireless LAN (local area network) system.

BACKGROUND OF THE INVENTION

The wireless LAN has been standardized by the IEEE (Institute of Electrical and Electronics Engineers) 802.11 committee. Also, data whitener encoding algorithms are described in IEEE, "Wireless LAN Medium Access Control (MAC) and Physical Layer (PHY) Specifications", Draft Standard IEEE 802.11, P802.11D3, pp. 179–180, 183–184 and 189, Jan. 25, 1996.

Referring to the drawings FIG. 1 shows a frame format described therein, a transmit frame used in a wireless LAN of frequency hopping spectrum spreading (FH-SS) type and with a transmit speed of 2 Mbps will be explained below.

As shown in FIG. 1, in the transmit frame, a 80-bit preamble 53 including a repetition of "1" and "0" and a following 16-bit start frame delimiter (SFD) 54 are transmitted to show that effective data follow to the receive side. After SFD 54, a 16-bit header 55 which includes information as to the transmit data length and the transmit frame is transmitted and then transmit data 56 actually desired to be transmitted is then transmitted. The transmit data 56 has a variable length.

Here, by whitener encoding, 2-bit stuff bits 52 are inserted at intervals of 64 bits. In order to suppress the DC bias to the transmit frame, the transmit data 56 are transmitted so that data in a 64-bit section are bit-inverted between logical high level "1" and low level "0" to the actual transmit data 56 by the whitener encoding.

In this case, the stuff bit 52 inserted before the 64-bit section to be bit-inverted is preset to be "11". Therefore, when the stuff bit 52 is the received transmit frame is "11", transmit data to follow this are bit-inverted again to receive the correct data by the receive side. CRC 57 for error check is added to the end of the transmit frame.

FIG. 2 is a block diagram showing an example of conventional data processing equipment for wireless LAN that is composed according to the whitener encoding algorithm describe din IEEE 802.11. Its operation will be explained with reference to FIGS. 1 and 2.

Parallel data type transmit data are first input to a parallel-to-serial converter (P to S) 11. The parallel-to-serial converter 11 converts the transmit data into serial data type. The serialized transmit data 56 are then randomized by a scrambler 12.

The scrambled data are then input to a n-bit (64-bit) shift register 13. The 64-bit shift register 13 takes out every 64-bit data from the transmit data 56 in the transmit frame 51. For the 64-bit data taken out, a weight circuit 36 and an adder A 31 add a weight to each bit. This is equal to conduct '(bias next block)=Sum {weight (b(32)}' in the IEEE 802.11 algorithm. Data b(1) to b(32) in this algorithm are 2-bit symbol data taken out by the 64-bit shift register 13, and data b(0) are the stuff bit 52. A 2-bit stuff insertion circuit 14c inserts the stuff bit 52 to every 64 bits in the frame. The initial value of the stuff bit 52 is b(0)=00.

As shown uppermost in a timing chart for explaining the operation in FIG. 3 and a timing chart for the following section in FIG. 4, the weight values are data to be weighted to every 2 bits, are described later, by the weight circuit 36. Here, the waveform of the second row in FIGS. 3 and 4 represents the output of the scrambler 12. For example, '81h' in section B1 represents data of '10000001', and a weight output corresponding to this data is '+3−3−3−1'. Namely, '+3' is output for 2 bit symbol data, '10', of the transmit data 56, '+1' for '11', '−1' for '01' and '−3' for '00'.

According to the above algorithm, for example, weight (b(1))=+3 for b(1)=10, weight (b(2))=−1 for b(2)=−01.

The adder A 31 is reset when starting the frame transmission and after conducting the operation for every 64 bits. By the resetting the content of the adder A 31 is cleared to be '0'.

Here, provided that the calculation result of the adder A 31 is signal 'bias' and the accumulated calculation result of an adder B 33 is signal 'accum', a comparator 33 judges whether or not (bias)*(accum)>0. This is equal to conduct 'If={[(accum)*(bias next block)>0]}then . . .' in the above-mentioned algorithm.

When the judged result is (bias)*(accum)>0, the comparator 33 outputs '0', and, when (bias)*(accum)<0, the comparator 33 outputs '1'.

When the comparator 33 outputs '0', a bit inversion circuit 15 conducts bit inversion to 64-bit data used in the operation of 'bias' when each of the 64-bit data is output. This is equal to conduct 'Invert{b(0), . . . , b(N)}' in the algorithm. When the comparator 33 outputs '1', the bit inversion is not conducted.

Also, when the comparator 33 outputs '0', a sign inversion circuit 34 conducts the inversion of the sign(+/−) of 'bias' to be output from the adder A 31. This is equal to conduct '(bias next block)=−(bias next block) ' in the algorithm. When the comparator 33 outputs '1', the inversion of sign is not conducted.

As described above, the adder A 31 conducts the addition of transmit data to ever 64- bit section, and the adder B 32 conducts the addition of the result obtained by the adder A 31. The result of the adder B 32 is stored in a register 35, and then the values of the adder A 31 and the register 35 are compared by the comparator 33 to every 64-bit section. According to the result of the comparator 33, the sign inversion circuit 34 inverts the code of the result of the adder A 31, and the bit inversion circuit 15 conducts the inversion of each bit, '1,''0', in the transmit data.

Next, the conventional whitener encoding operation will be explained with reference to FIGS. 2, 3 and 4. FIGS. 3 and 4 show an example of transmit data after scrambling. (E3h, CAh, 9Bh, 87h, BFh, DFh, 3Eh, EFh) (section A1 in FIG. 3), (81h, C3h, 38h, 63h, 2Ah, 39h, 85h, 89h) (section B1 in FIG. 3), and (A4h, B2h, 61h, 2Ah, 4Bh, CCh, 9Ah, 58h) (section C1 in FIGS. 3 and 4), which are hexadecimal data and are sequentially transmitted from each LSB.

For example, when '63h' is transmitted from LSB, '11000110' is sent out. Though data in section A1 are not shown in FIG. 3, they are equal to A2.

The data in section A1 are shifted by 64 bits by the 64 bit shift register 13 and are transmitted to section A2 as transmit data. In like manner, data in section B1 is transmitted to section B2 and data in section C1 are transmitted to section C2. The reason why data are thus shifted by 64 bits is that 64-bit data have to be transmitted after judging whether to conduct bit-inversion or not after calculating a weight according to a weight operation method described later to the 64-bit data.

The adder A 31 conducts the addition of 64-bit data while weighting. The weight is '+3' for data '10', '+1' for '11', '−1' for '01' and '−3' for '00'. According to this, for example, when '11000110' is added with the weights, (11)+(00)+(01)+(10)=+1−3−1+3=0 is obtained.

At timing (1) in FIG. 3, calculating the sum of weight values in section A1 by the weight circuit 36 and the adder A 31, +1−3−1+1−1−1−3+1+1−1+3−1+1+3+1−1+1+1−1+1+1+3+1−1+1+1−3+1+1−1+1=+8 is obtained. As to section A1, the result of the adder A 31 is, as it is, stored in the register 35.

At timing (2) in FIG. 3, calculating the sum of weight values in section B1 by the weight circuit 36 and the adder A 31, +3−3−3−1+1−3−3+1+1−1+1−3+1−3−1+3+1−1−1−3+3−1+1−3+3+3+3+3−3−1−1+3−1−3−1=−16 is obtained.

Also, at this timing, the result (=−16) of the adder A 31 and the value (=+8) of the register 35 are compared by the comparator 33. Thereby (bias)*(accum)<0 is obtained, and therefore no signal to invert data is output to the sign inversion circuit 34 and bit inversion circuit 15.

In FIG. 3, the comparator 33 outputs '1'. Namely, the inversion of sign is not conducted, and therefore the sign inversion circuit 34 outputs '−16' and the transmit data in section B2 are transmitted as data in section B1 as it is without bit-inverting. The adder B 32 adds the output (−16) of the sign inversion circuit 34 to the output (+8) of the register 35, thereby (−8) is obtained. The result of the adder B 32 is stored in the register 35.

In like manner, at timing (3) in FIG. 4, calculating the sum of weight values in section B1 by the weight circuit 36 and the adder A 31, −3+3−1−1−1−3+1−1+3−3−1+3−3+3−1−3+1−1−3+3−3+1−1−1+3−1−3−3+3+3=−10 is obtained.

At this timing, the result (=−10) of the adder A 31 and the value (=−8) of the register 35 are compared by the comparator 33. Thereby (bias)*(accum)>0 is obtained, and therefore a signal to invert data is output to the sign inversion circuit 34 and bit inversion circuit 15.

In FIG. 4, the comparator 33 outputs '0'. Namely, the inversion of sign is conducted, and therefore the sign inversion circuit 34 outputs '+10' and the transmit data in section C2 are transmitted by bit-inverting data in section C1. The adder B 32 adds the output (+10) of the sign inversion circuit 34 to the output (−8) of the register 35, thereby (+2) is obtained. The result of the adder B 32 is stored in the register 35.

For the section that transmit data are bit-inverted, the stuff bit is '11'. When the receive side judges that the stuff bit is '11', it inverts 64-bit data to follow again.

The effect of the whitener encoding for suppressing DC bias is as follows: For example, when data in section C2 are not inverted. the value of the register 35 after completing section C2 is −16=+8 (register value for section B1)−16 (output of the sign inversion circuit 34)−10(sum of weight values for section C1). Therefore, the weight value of the transmit data must be biased to (−) side. Here, by bit-inverting data in section C2, the register value becomes (+8−16 +10)=+2. Thus, the weight value is not highly biased, while it is moved to (+) side.

By conducting the above-mentioned data processing, the numbers of '1' and '0' in the transmit data can be adjusted, thereby suppressing the DC bias of the transmit data.

However, the conventional data processing equipment for conducting the whitener encoding must have an increased circuit composition. This is because it is composed of the two adders 31, 32 to conduct the weight operation, the sign inversion circuit 34 to invert the weight operation result, the register 35 to store the past weight operation result and the comparator 33 to judge whether to invert the transmit data or not, other than the shift register 13 and bit stuff circuit 14.

SUMMARY OF THE INVENTION

Accordingly, it is an object of the invention to provide data processing equipment whose circuit composition is simplified to reduce the circuit size.

It is a further object of the invention to provide a data processing method where the whitener encoding to suppress DC bias in transmit data is conducted while simplifying the circuit composition.

According to the invention, data processing equipment for conducting the whitener encoding to suppress DC bias of transmit data in a communication device, comprises:

a demultiplexer to which transit data to be parallel-to-serial-converted from parallel data type to serial data type and then randomized by a scrambler are supplied;

a first counter which counts by +(2m+1) when 2-bit symbol data in a data section where the transit data to be supplied from the demultiplexer are sectioned by an arbitrary bit number n have a logical level of '10', counts by +(2m−1) when the 2-bit symbol data have a logical level of '11', counts by −(2m−1) when the 2-bit symbol data have a logical level of '01' and counts by −(2m+1) when the 2-bit symbol data have a logical level of '00', where m is an integer to satisfy m≧1 and n is an even number to satisfy n≧4;

a second counter which counts by +(2m +1) when the 2-bit symbol data in all data sections before the data section have a logical level of '10', counts by +(2m−1) when the 2-bit symbol data have a logical level of '11', counts by −(2m−1) when the 2-bit symbol data have a logical levle of '01' and counts by −(2m+1) when the 2-bit symbol data have a logical level of '00', where m is an integer to satisfy m≧1, means for comparing a sign bit of the first counter with a sign bit of the second counter;

two bit-inversion circuits which invert between '1' and '0' of the data in the data section according to the result of the comparing means;

two n/2-bit shift registers which delay by n-bit data in the data section; and two bit-stuff circuits which insert two-bit stuff bit to the delayed n-bit data supplied from the two n/2-bit shift registers and output the stuff-bit-inserted n-bit data to the two bit-inversion circuits.

According to another aspect of the invention, a method of conducting the whitener encoding algorithm to adjust the number of '10', '11', '01' and '00' in transmit data so as to suppress DC bias of transmit data, by using a data processing equipment comprising a demultiplexer to which transmit data to be parallel-to-serial-converted form parallel data type to serial data type and then randomized by a scrambler are supplied; a first counter which counts by +(2m+1) when 2-bit symbol data in a data section where the transmit data to be supplied from the demultiplexer are sectioned by an arbitrary bit number n have a logical level of '10', counts by +(2m−1) when the 2-bit symbol data have a logical level of '11', counts by −(2m −1) when the 2-bit symbol data have a logical level of '01' and counts by −(2m+1) when the 2-bit symbol data have a logical level of '00', where m is an integer to satisfy m≧1 and n is an even number to satisfy n≧4; a second counter which counts by +(2m+1) when the 2-bit symbol data in all data sections before the data section have a logical level of '10', counts by +(2m−1) when the 2-bit symbol data have a logical level of '11', counts by −(2m−1) when the 2-bit symbol data have a logical level '01' and counts by −(2m+1) when the 2-bit symbol data have a logical level of '00', where m is an integer to satisfy m≧1, means for comparing a sign bit of the first counter with a sign bit of the second counter; two bit-inversion circuits which invert between '1' and '0' of the data in the data section according to the result of the comparing means; two n/2-bit shift registers which delay by n-bit data in the data section; and two bit-stuff circuits which insert two-bit stuff bit to the delayed n-bit data supplied from the two n/2-bit shift registers and outputs the stuff-bit-inserted n-bit data to the two bit-inversion circuits, comprising the steps of:

transmitting data in the data section after passing the bit number of n-bit data section so as to transmit data in the data section by the two n/2-bit shift registers count after the first counter counts a weight value to the n-bit data section;

inserting the two-bit stuff bit to the data section by the two bit-stuff circuits so as to be used in the whitener encoding on the receive side;

showing that the weight value of data in the n-bit data section before transmission is on the positive (+) or negative (−) side according to the count result of the first counter;

showing that a weight value of data to be already transmitted is on the positive (+) or negative (−) side according to the count result of the first counter;

judging whether the weight values of the first and second counters are both on the positive(+) or negative(−) side or not by comparing MSBs as sign bits showing signs of the weight values in the first and second counters by the comparing means;

transmitting data in the data section counted by the first counter with inverting them by the two bit-inversion circuits so as not to bias the weight value of the transmit data in the same direction as the already transmitted data when judged that the weight values of the first and second counters are both on the positive(+) or negative(−) side, or without inverting them by the two bit-invention circuits when judged that one of the weight values is on positive(+) side and the other is on the negative(−) side.

BRIEF DESCRIPTION OF THE DRAWINGS

The invention will be explained in more detail in conjunction with the appended drawings, wherein.

DESCRIPTION OF THE PREFERRED EMBODIMENTS

In the invention, two counters are used to conduct the weight operation in whitener encoding algorithm. In the weight operation for n-bit section to be concerned currently, the first counter up-counts (+3) for 2-bit symbol data. '10', in transmit data, up-counts (+1) for '11', down-counts (−3) for '01' and down-counts for '00'. Also, in the weight operation for transmitted data, the second counter up-counts (+3) for 2-bit symbol data, '10', in transmit data, up-counts (+1) for '11', down-counts (−1) for '01' and down-counts (−3) for '00'. A comparator judges whether to invert the transmit data or not by comparing MSBs (most significant bits) to represent the sign of the counters.

Figure 5:
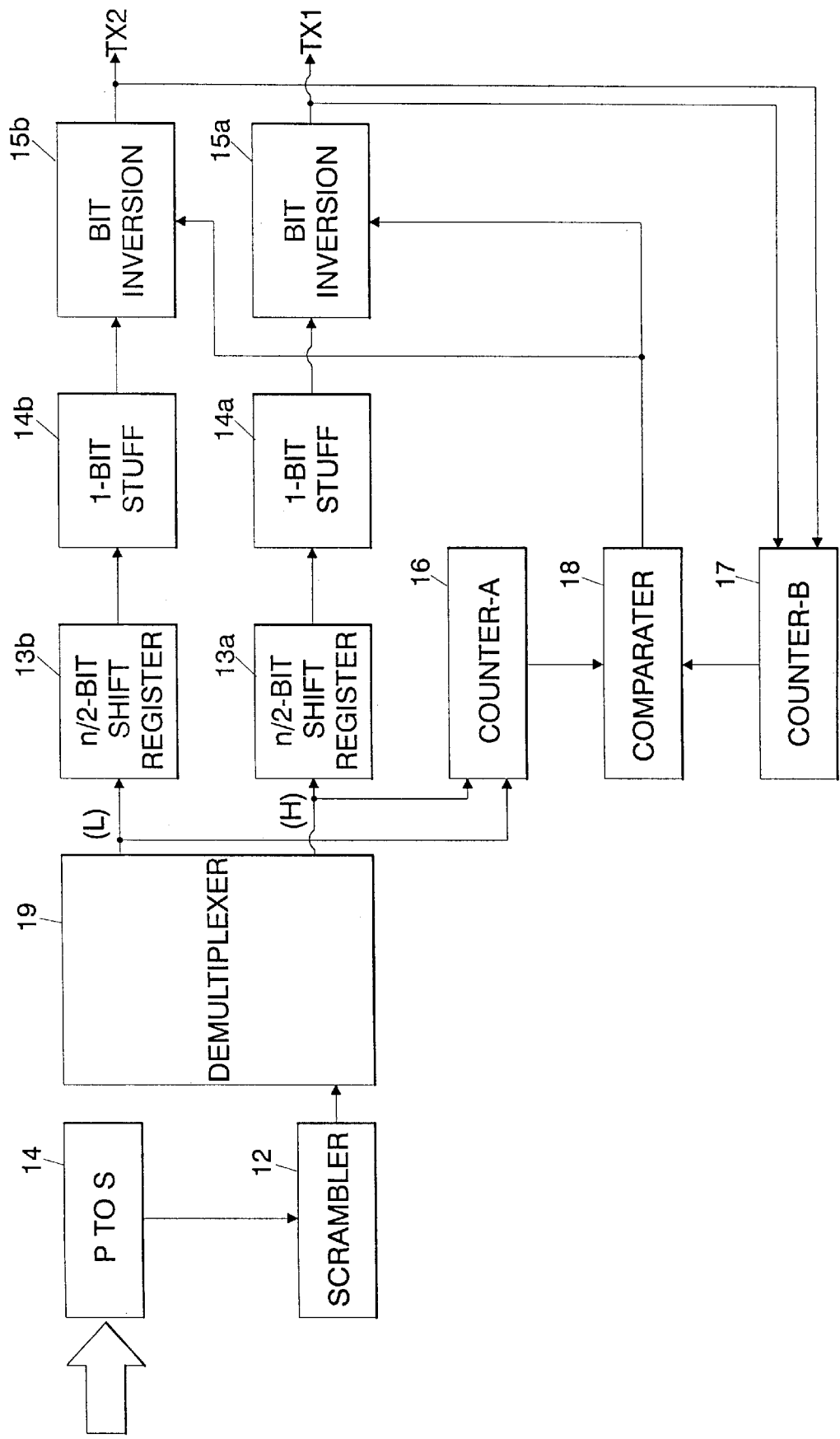
FIG. 5 is a block diagram showing a data processing equipment in a preferred embodiment according to the invention.
Figure 6:
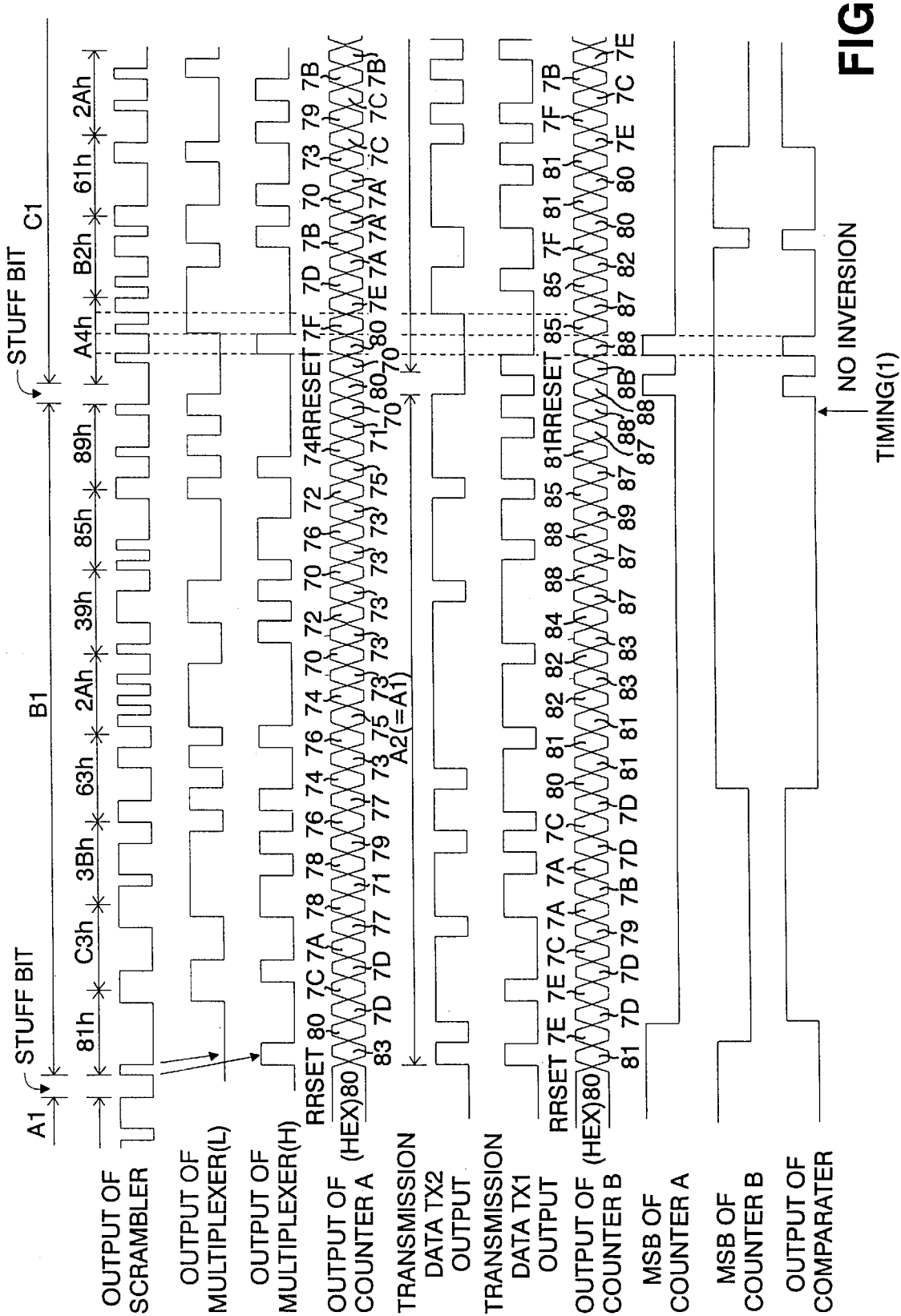
FIG. 6 is a timing chart showing the operation of the equipment in FIG. 5
Figure 7:
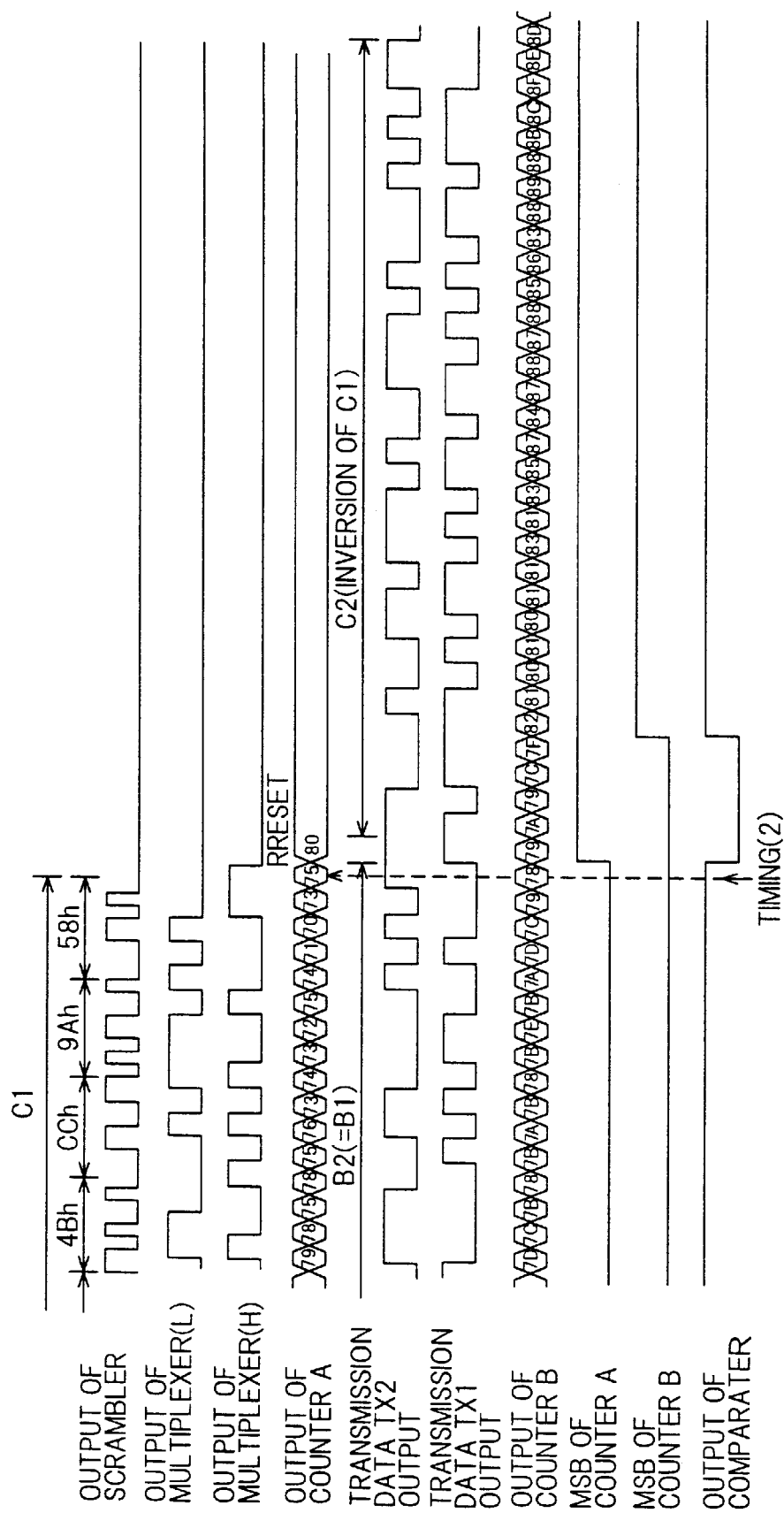
FIG. 7 is a timing chart to follow that in FIG. 6.

Next, data processing equipment for whitener encoding in the preferred embodiment will be explained in FIGS. 5 to 7. FIG. 5 is a block diagram showing the data processing equipment in the embodiment. FIGS. 6 and 7 are timing charts illustrating the operation.

Referring to FIG. 5, the data processing equipment is composed of a parallel-to-serial converter 11 for converting parallel data to be transmitted into serial data, a scrambler 12 for randomizing the transmit data supplied from the parallel-to-serial converter 11, demultiplexer 19 for distributing the data supplied from the scrambler into a high-order bit and a low-order bit to every 2 bits and outputting the high-order bit data line and low-order bit data line, n/2-bit shift registers 13a, 13b for shifting sequentially the n/2-bit data line supplied from the demultiplexer 19, 1-bit stuff circuits 14a, 14b for inserting one it to every n/2 bits in the transmit data supplied from each of the n/2-bit shift registers 13a, 13b, a counter A 16 for up- and down-counting (+3, +1, −1, −3) according to the transmit data in n/2-bit section to be concerned currently and supplied form the demultiplexer 19 to the n/2-bit shift register 12a or 13b, a counter B 17 for up- and down-counting (+3, +1, −1, −3) according to data already transmitted, a comparator 18 for judging whether to invert the transmit data or not by comparing the count value data of the counter A 16 and counter B 17, and bit inversion circuits 15a, 15b for inverting each one bit of the data output from the 1-bit stuff circuits 14a, 14b according to the instructions from the comparator 18 and outputting them as transmit data TX1, TX2 as well as outputting them as the transmitted data to the counter B 17.

These components will be detailed below. The demultiplexer 19 handles the serial data output from the scrambler 12 as two-bit symbol data and outputs two bits each.

The n/2-bit shift registers 13a, 13b are 32-bit shift registers. For every 32-bit section, the one bit insertion to the transmit data form the 1-bit stuff circuits 14a, 14b and the comparison of the comparator 18 are conducted.

The counter A 16 is set to be reset for every 32 bits, and the counter B 17 is not reset until the transmission of one frame is completed since it stores data to be transmitted in the past.

Further, the counter A 16 is compose of a 8-bit up-down counter to count every 2 bits of the transmit data. It up-counts by +3 for 2-bit data, '10', up-counts by +1 for '11', down-counts by −1 for '01' and down-counts by −3 for '00'. The initial value is '80h' as hexadecimal digit(= 1000000b as binary digit). p Hereinafter, 'h' after alphanumeric character denotes a hexadecimal digit and 'b' after alphanumeric character denotes a binary digit. MSB of a counter A 16 represents a sign, i.e., MSB of '1' represents positive(+) and MSB of '0' represents negative(−).

Also, the counter B 17 is composed of a 8-bit up-down counter to count every 2 bits of the transmit data. It up-counts by +3 for 2-bit data, '10', up-counts by +1 for '11', down-counts by −1 for '01' and down-counts by −3 for '00'. The initial value is '80h' as hexadecimal digit (=10000000b as binary digit). MSB of the counter B 17 represents a sign, i.e., MSb of '1' represents positive(+) and MSB of '0' represents negative(−).

The comparator 18 outputs '0' when both input data are '1' or '0', and outputs '1' when one of input data is '0' and the other is '1'. Also, the comparator 18 compares MSBs of the sign bits of the counter A 16 and counter B 17. When both MSBs of the counters are '0' or '1', i.e., (sign of counter A 16)*(sign of counter B)>0, the comparator 18 outputs '0'. On the contrary, when one of MSBs is '0' and the other is '1', i.e., (sign of counter A 16)*(sign of counter B)<0, the comparator 18 outputs '1'. When the comparator 18 outputs '0', the bit inversion circuits 15a, 15b conduct the inversion of transmit data.

The bit inversion circuit 15 inverts every one bit of the transmit data in n-bit section when the comparison result of the comparator 18 is '0' (sign accordance output), and it does not invert the transmit data when the comparison result is '1' (sign disaccord output).

As explained as to prior art, the bit inversion circuit 15 inverts the transmit data to suppress DC bias of the transmit data. Whether to invert the transmit data or not is determined by the comparator 18, which compares MSBs of the sign bits of the counter A 16 and counter B 17 and actuates the bit inversion circuit 15 only when both the sign bits of the counters are equal.

Next, the operation of the data processing equipment in the embodiment will be explained referring to FIGS. 5 to 7.

First of all, the schematic total operation will be explained in order to make the understanding easy. Parallel data type transmit data are converted into serial data type by the parallel-to-serial converter 11. Then, the transmit data is converted into serial data type are input to the scrambler 12, and are randomized by the scrambler 12.

The randomized data are then output from the scrambler 12 to the demultiplexer 19, distributed into two outputs by every one bit. The distributed data are supplied to n/2-bit shift registers 13a, 13b.

Before transmitting the transmit data, the n/2-bit shift registers 13a, 13b stores and delays by n-bit data since the n-bit transmit data have to be operated to judge whether to invert them or not.

Meanwhile, the data processing equipment concerned is provided with two n/2-bit shift registers. Namely, it can totally handle n-bit data. The outputs of the n/2-bit shift registers 13a, 13b are supplied to the corresponding 1-bit stuff circuits 14a, 14b. Each of the 1-bit stuff circuits 14a, 14b inserts one-bit stuff bit to n/2 bits in data field of transmit frame. Namely, from the viewpoint of n-bit sections, two-bit stuff bit is inserted. The initial values inserted by the 1-bit stuff circuits 14a, 14b are both '0', i.e., '00' as two-bit stuff bit.

The outputs of the 1-bit stuff circuits 14a, 14b are supplied to the corresponding bit inversion circuits 15a, 15b. According to the instructions from the comparator 18, the bit inversion circuits 15a, 15b invert every one bit of the transmit data in n-bit section when the comparison result of the comparator 18 is '0' (sign accordance output), and they do not invert the transmit data when the comparison result is '1' sign disaccord output).

Further, the operation of the data processing equipment in the embodiment will be detailed. The timing chart in FIGS. 6 and 7 shows an example of transmit data, (6Eh, CAh, 9Bh, B7h, BFh, DFh, 3Eh, EFh) (section A1 in FIG. 6), (81h, C3h, 3Bh, 63h, 2Ah, 39h, 85h, 89h) (section B1 in FIG. 6), and (4Ah, B2h, 61h, 24h, 4Bh, CCh, 9Ah, 58h) (section C1 in FIGS. 6 and 7), which are hexadecimal data and are sequentially transmitted from each LSB (least significant bit).

For example, when '63h(=01100011)' is transmitted from LSB, '11000110b' is sent out. Though data in section A1 are not completely shown in FIG. 6, they are equal to A2 shown in the transmit data TX2.

Data in section B1 are output by every two bits trough the multiplexer 19, then shifted totally by 64 bits by the 32-bit shift registers 13a, 13b, transmitted to section B2 as transmit data. In like manner, data in section C1 are transmitted to section C2. The reason why data are thus shifted by 64 bits is that 64-bit data have to be transmitted after judging whether to conduct bit-inversion or not after calculating a weight according to a weight operation method, described later, to the 64-bit data.

The counter A 16 counts weight values as to 64-bit data section. Namely, it up-counts by +3 for 3-bit symbol data, '10', to be output from the multiplexer 19, up-counts by +1 for '11', down-counts by −1 for '01' and down-counts by −3 for '00'. The counter A 16 is a 8-bit counter that includes 7 bits needed to count 3*32 times in view of the case that all 2-bit data of a 64-bit section are '10' or '00', and 1 bit as the sign bit. Thus, it can count a value from −127 to +127.

The counter A 16 has a value of '80h' when reset. The reset is conducted at the timing that the stuff bit is inserted to the transmit data line. For example, when scrambled data '81h' at the beginning part of section B1 in FIG. 6 are counted by the counter A 16, the scrambler 12 outputs '10000001' as LSB first, and then the multiplexer 19 outputs sequentially '10', '00','00' and '01'. As the weight values are +3, −3, −3 and −1, the value of the counter A 16 are changed through (80h)+3=(83h), (83h)−3=(80h) and (80h)−3=(7Dh) to (7Dh)−1=(7Ch). Meanwhile, the counter A 16 conducts the count operation as to data before conducting the whitener encoding because it counts the output of the multiplexer 19.

On the other hand, the counter B 17 counts weight values as to all data to be transmitted from the bit inversion circuits 15a, 15b. Like the counter A 16, the counter B 17 up-counts by +3 for 2-bit symbol data, '10', to be output from the demultiplexer 19, up-counts by +1 for '11', down-counts by −1 for '01' and down-counts by −3 for '00'. The counter B 17 is a 8-bit counter that includes 7 bits needed to count 3*32 times in view of the case that all 2-bit data of a 64-bit section are '10' or '00', and 1 bit as the sign bit. Thus, it can count a value from −127 to +127.

The counter B 17 also has a value of '80h' when reset. The reset is conducted at the timing before counting the weight value as to the beginning data of one transmit frame, and is not conducted again until the transmission of one transmit frame is completed. Meanwhile, the counter B 17 conducts the count operation as to data after bit-inverting, i.e., after suppressing DC bias because it counts, as described above, weight values as to all data to be transmitted from the bit inversion circuits 15a, 15b.

Again referring to FIG. 6, the counter A 16 counts weight values as to data in section B1. At the timing of stuff bit, the counter A 16 is reset to have the initial value '80h'. Then, data in section B1 follow like '1000000111000011...', and then the demultiplexer 19 outputs sequentially '10', '00', '00', '01', '11', '00', '00', '11'. . . As the weight values are +3, −3, −3, −1, +1, −3, −3, +1. . . , the value of the counter A 16 is changed like (83h), (80h), (7Dh), (7Ch), (7Dh), (7Ah), (77h), (78h) . . . Finally, at timing (1), a result of '7h' is obtained.

On the other hand, the counter B 17 counts weight values as to data to be already transmitted in section A2. At the timing after transmitting data in section A2, the counter B 17 is reset to have the initial vale '80h'. Then, data in section A2 follow like '1100011001010011. . . ' (not shown), and then the demultiplexer 19 outputs sequentially '11', '00', '01', '10', '01', '01', '00', '11'. . . As the weight values are +1, −3, −1, +3, −1, −1, −3, +1. . . , the value of the counter B 17 is changed like (81h), (7Eh), (7Dh), (7Eh), (7Dh), (7Ch), (79h), (7Ah) . . . Finally, at timing (1), a result of '88h' is obtained.

At timing (1), MSB of the counter A 16 is '0' and MSB of the counter B 17 is '1'. The exclusive-OR operation of the comparator 18 conducts the exclusive-OR operation of the two MSBs, thereby obtaining a result of '1'. When the exclusive-OR gate outputs '1' at timing (1), data in section B1 when transmitted, i.e., data in section B2 are not bit-inverted. This shows that the weight value of section B1 to be transmitted from now on is on the negative(−) side and the weight value of section A2 to be transmitted already is on the positive(30 ) side. Namely, the weight value is evened by transmitting the section B1 data, as it is, without bit-inverting when the section B2 data are transmitted following the section A2 data.

In like manner, at timing (2) in FIG. 7, the counter A 16 counts data in section C1, thereby obtaining a result of '76h'. Also, the counter B 17 counts data in sections A2 and B2, thereby obtaining a result of '78h'. Here, it is known that the weight value is biased to the positive(+) side when transmitting section A2 data, but the weight value is biased to the negative(−) side by transmitting the section B2 data without bit-inverting.

At timing (2), MSB of the counter A 16 is '0' as the output is '01110110' and MSB of the counter B 17 is also '0' as the output is '01111000'. The comparator 18 compares the two MSBs, thereby obtaining a result of '0' due to the accordance of MSB.

When the comparator 18 outputs '0' at timing (2) in FIG. 7, the section C1 data when transmitted, i.e., section C2 data, are bit-inverted.

This shows that the weight value of section C1 data to be transmitted from now on is one the negative(−) side and the weight value of section A2+B2 data to be transmitted already is also on the negative(−) side. Namely, the weight value is evened not to be biased to the negative(−) side by transmitting the section C1 data with bit-inverting when the section C2 data are transmitted following the section B2 data. In fact, it is known that the weight value is on the positive(−) side as the value of the counter B 17 after transmitting the section C2 data is '8Dh'.

Though the data transmission ends by section C1(=section C2) in FIG. 7, for further data transmission, the count operation and the judgment of whether to bi-invert are repeated to every 64-bit data.

To a section where transmit data are bit-inverted, one stuff bit each for TX1 and TX2 is inserted just before the section. When the stuff bit is '11' as 2-bit stuff, the receive side judges the stuff bit '11' and inverts again 32-bit data to follow, thereby obtaining correct data.

As explained above, in the conventional whitener encoding, section B2 data are not inverted and section C2 data are inverted, and, also in the whitener encoding according to the invention, section B2 data are not inverted and section C2 data are inverted.

Thus, the number of '10', '11', '01' and '00' in transmit data can be adjusted, thereby suppressing DC bias in the transmit data. Here, the 2-bit symbol data values of '10', '11', '01' and '00' change the modulation frequency of a wireless modem connected to the TX1 and TX 2 terminals.

Figure 8:
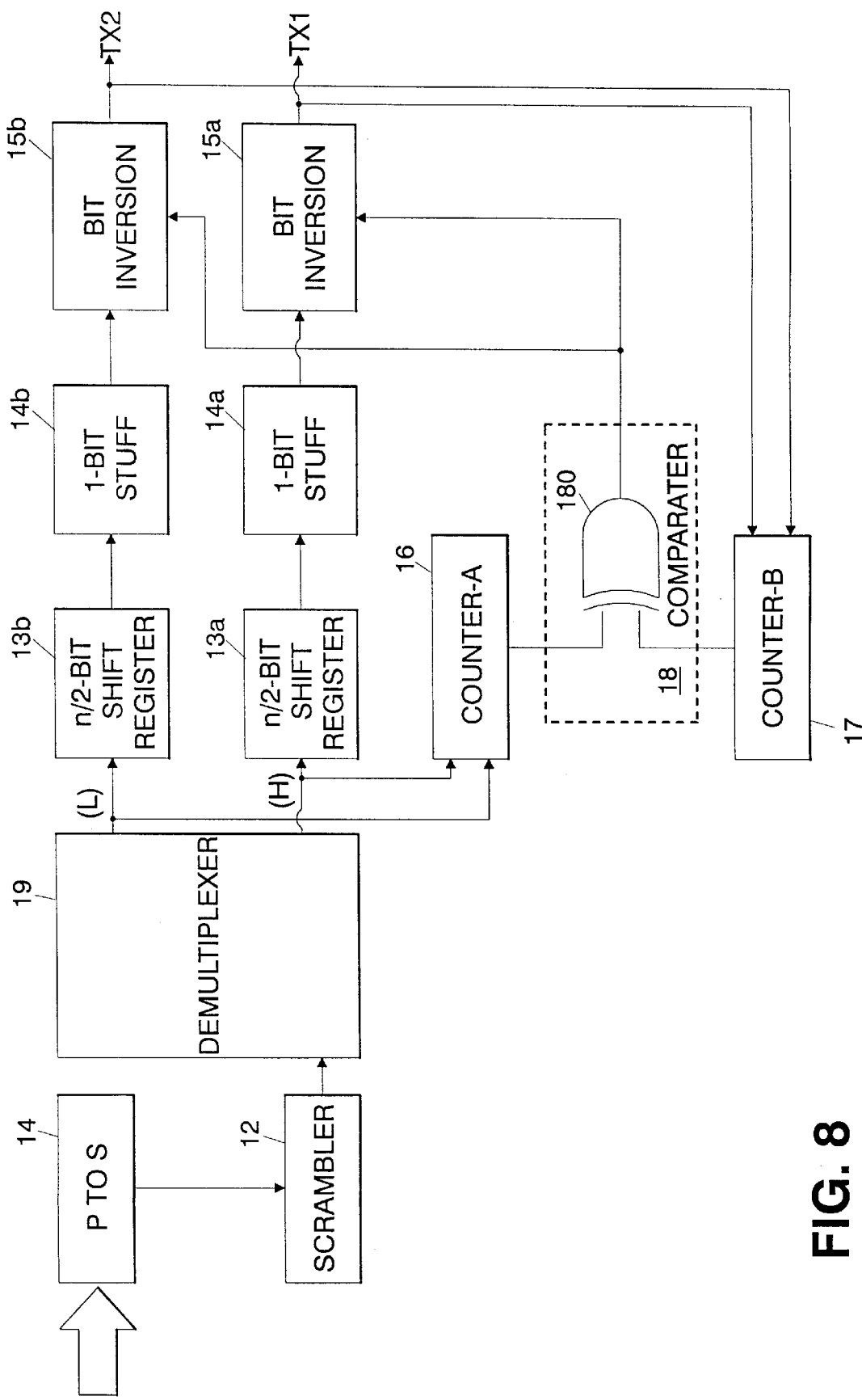
FIG. 8 is a block diagram showing the data processing equipment which includes a specific example of a comparator in FIG. 5

FIG. 8 is a block diagram showing the data processing equipment, which includes a specific example of the comparator 18, in the embodiment. The comparator 18 uses an exclusive-OR gate 180. The exclusive-OR gate 180, as commonly known, outputs '0' when two data compared are identical, and outputs '1' when they are different from each other. As described earlier, at timing (1), MSB of the counter A 16 is '0' and MSB of the counter B 17 is '1'. Therefore, when the exclusive-OR gate 180 of the comparator 18 conducts the exclusive-OR operation of the two MSBs, a result of '1' is obtained. When the exclusive-OR gate 180 outputs '1', the section B2 data are not bit-inverted.

In like manner, at timing (2), MSB of the counter A 16 is '0' as the output is '01110110' and MSB of the counter B 17 is also '0' as the output is '01111000'. The comparator 18 conducts the exclusive-OR operation of the two MSBs, thereby obtaining a result of '0'.

When the exclusive-OR gate 180 outputs '0' timing (2) in FIG. 7, the section C1 data when transmitted, i.e., section C2 data, are bit-inverted.

Figure 9:
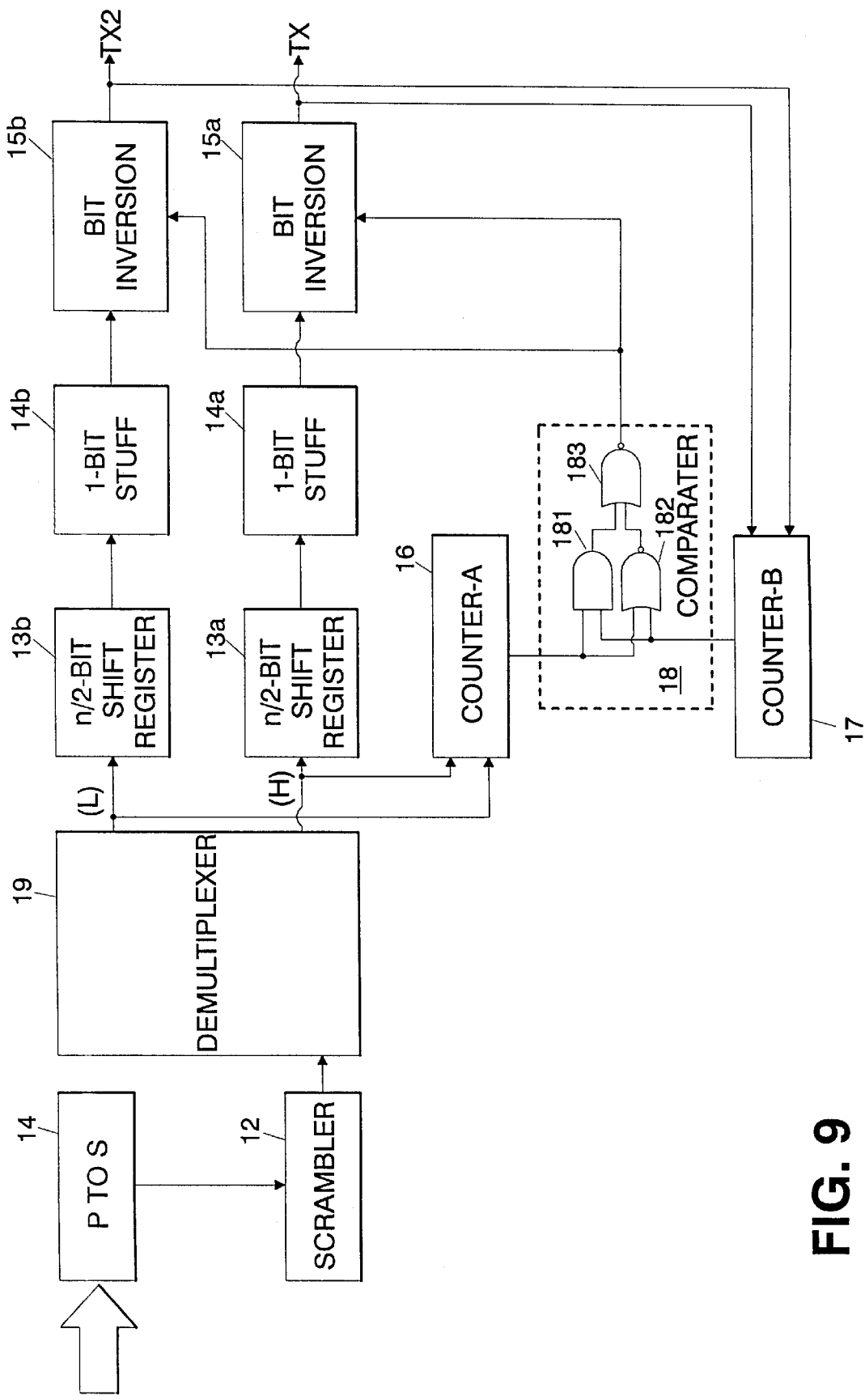
FIG. 9 is a block diagram showing the data processing equipment which includes another specific example of the comparator in FIG. 5.

FIG. 9 is a block diagram showing the data processing equipment, which includes another specific example of the comparator 18, in the embodiment. As shown, the comparator 18 is composed of an AND gate 181 and a NOR gate 182 to which the outputs of the counter A 16 and counter B 17 are input, and a NOR gate 183 to which the outputs of the AND gate 181 and NOR gate 182 are input and which outputs a comparison result to the bit inversion circuits 15*a*, 15*b*.

The comparator 18 in FIG. 9 also outputs '0' when both MSBS of the counter A 16 and counter B 17 are '0' or '1', and outputs '1' when one of them is '0' and the other is '1'. Thus, it can have the same result as the comparator 18 in FIG. 8 using the exclusive-OR gate 180.

Figure 10:
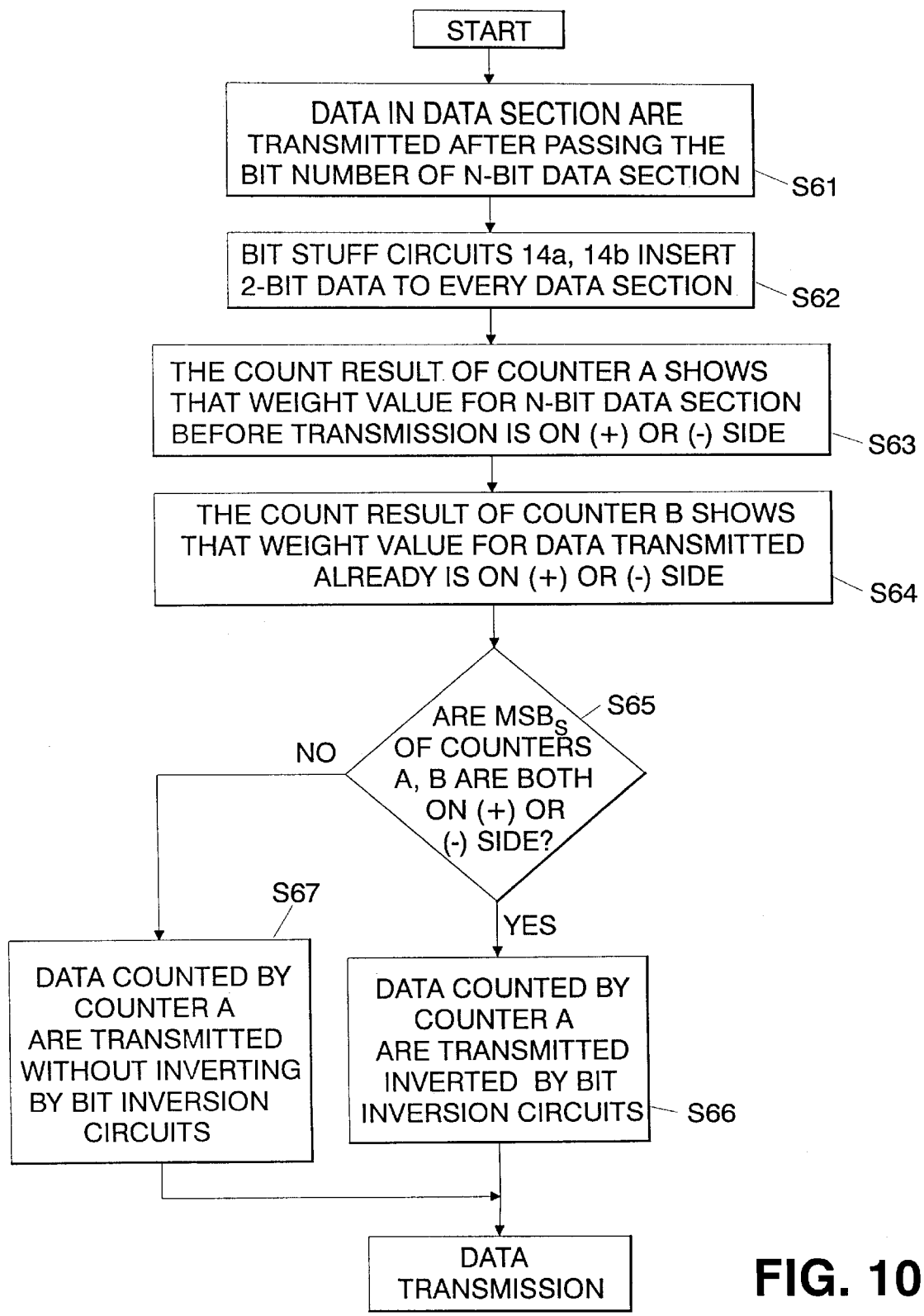
FIG. 10 is a flow chart showing the operation of the equipment in FIG. 5.

FIG. 10 is a flow chart showing the data processing algorithm of the data processing equipment in the embodiment. Referring to FIG. 10, the two n/2-bit shift registers 13*a*, 13*b* transmit data in a data section after passing the n-bit data section bit number so as to transmit the data after the first counter A 16 (Step S61) has counted a weight value for the n-bit data section, then the two bit-stuff circuits 14*a*, 14*b* insert 2-bit data to every data section to be used in the whitener encoding at the receive side (Step S 62), then the count result of the first counter A 16 shows that the weight value for the data in n-bit data section before transmission is on the positive(+) or negative(−) side (Step S63), then the count result of the second counter B 17 shows that the weight value for data to be transmitted already is on the positive(+) or negative (−) side (Step S64), the comparator 18 compares MSBs as sign bits of the counters A 16, 17B to judge whether or not the weight values of transmit data are both on the positive(+) or negative(−) side (Step S65), the data in data section counted by the counter A 16 are transmitted inverted by the two bit inversion circuits 15*a*, 15*b* not to bias the weight value of transmit data in the same direction as the already transmitted data when judged the weight values of the counters A 16, B 17 are both on the positive(+) or negative(−) side (Step S66), and the data in data section counted by the counter A 16 are transmitted without inverting by the two bit inversion circuits 15*a*, 15*b* when judged one of the weight values is on the positive(+) side and the other is on the negative(−) side (Step S67).

In this embodiment, the counter A 16, B 17 are composed of a well-known 8-bit up-down counter, and conduct the count operation by inputting a clock from the clock terminal. When the input of up-down control terminal is '1', they up-count and, when it is '0', they down-count. Also, when the input of count control terminal is '1', they count by 1, and, when it is '0', they count by '3', and then they count result is output from the output terminal. When the input of reset terminals is '1', they are reset to have the initial value of '80h'. In view of counting a weight value of '3' by 32 times at maximum, 7 bits are needed as they have to count by 96. Further, 1 bit is needed as a sign bit. Thus, the number of counter steps required is 8 bits, about 92 gates.

Figure 1:
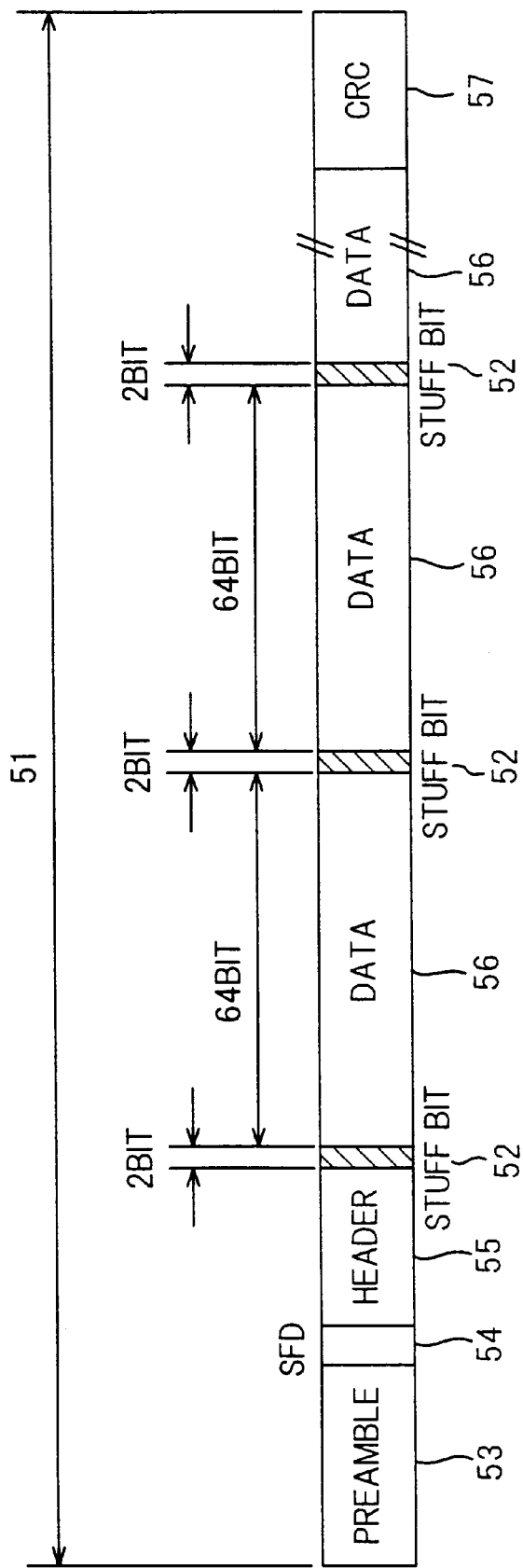
FIG. 1 is an illustration showing a frame format used conventionally in wireless LAN.
Figure 2:
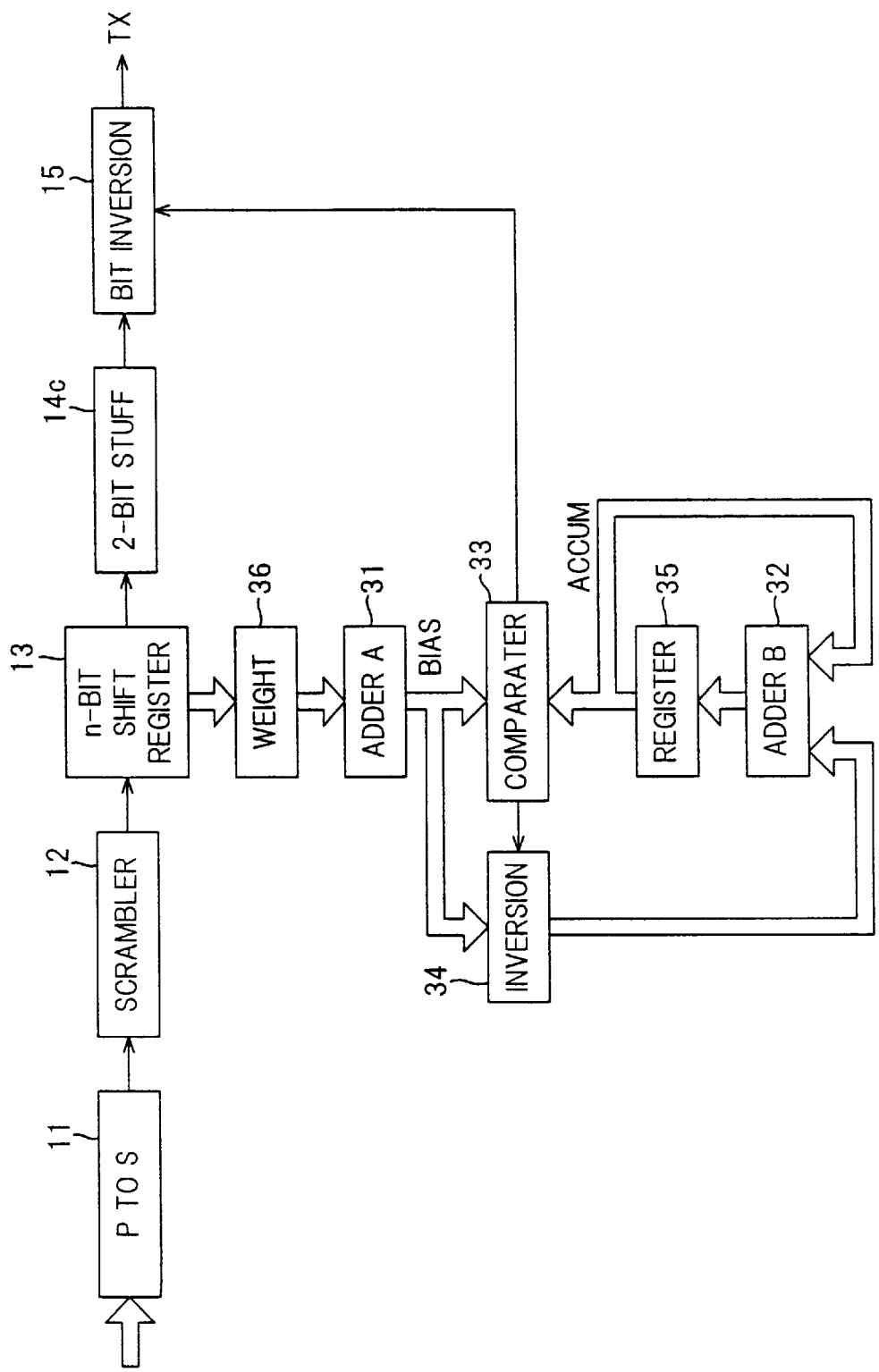
FIG. 2 is a block diagram showing a conventional data processing equipment used in wireless LAN.
Figure 3:
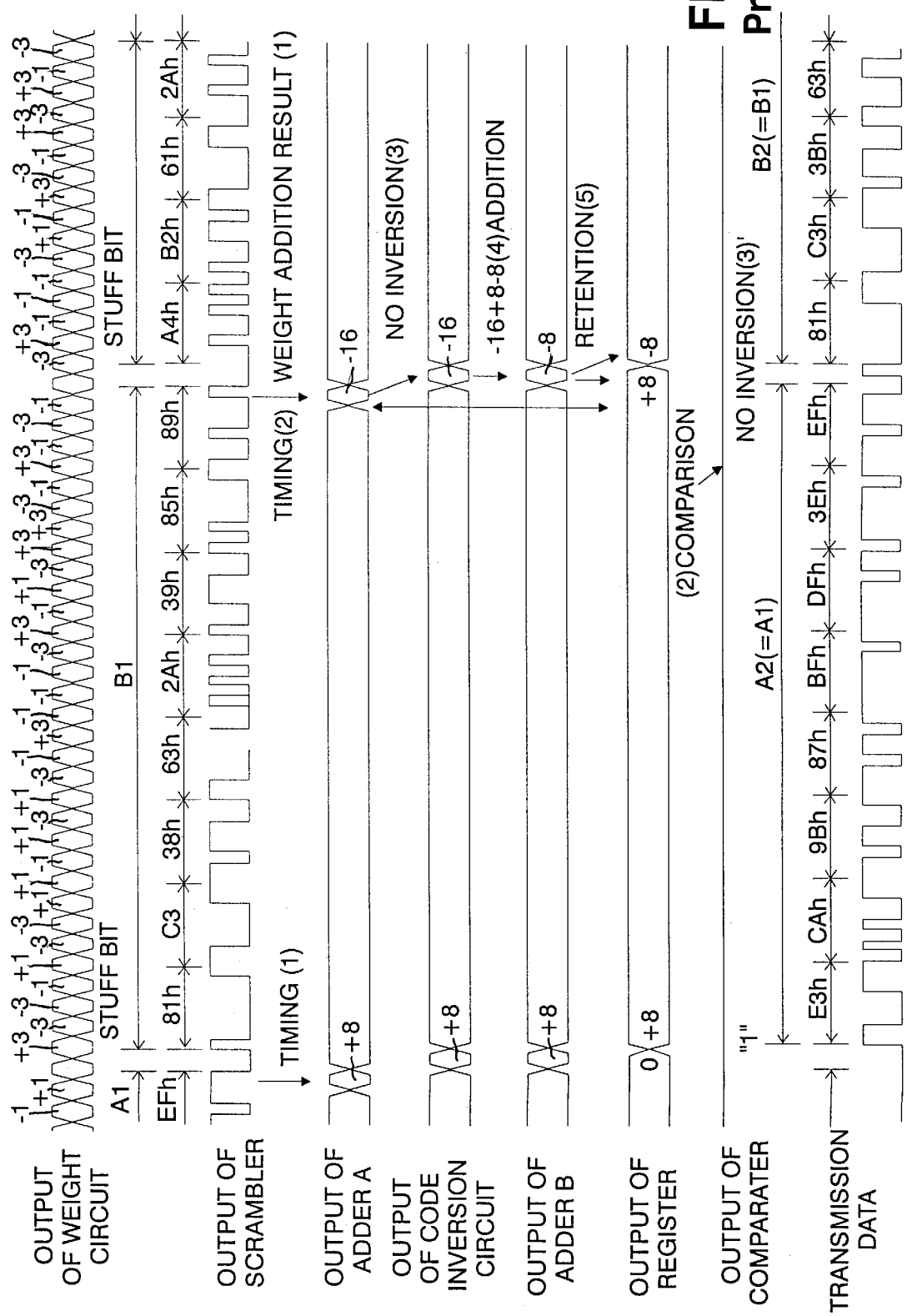
FIG. 3 is a timing chart showing the operation of the equipment in FIG. 2.
Figure 4:
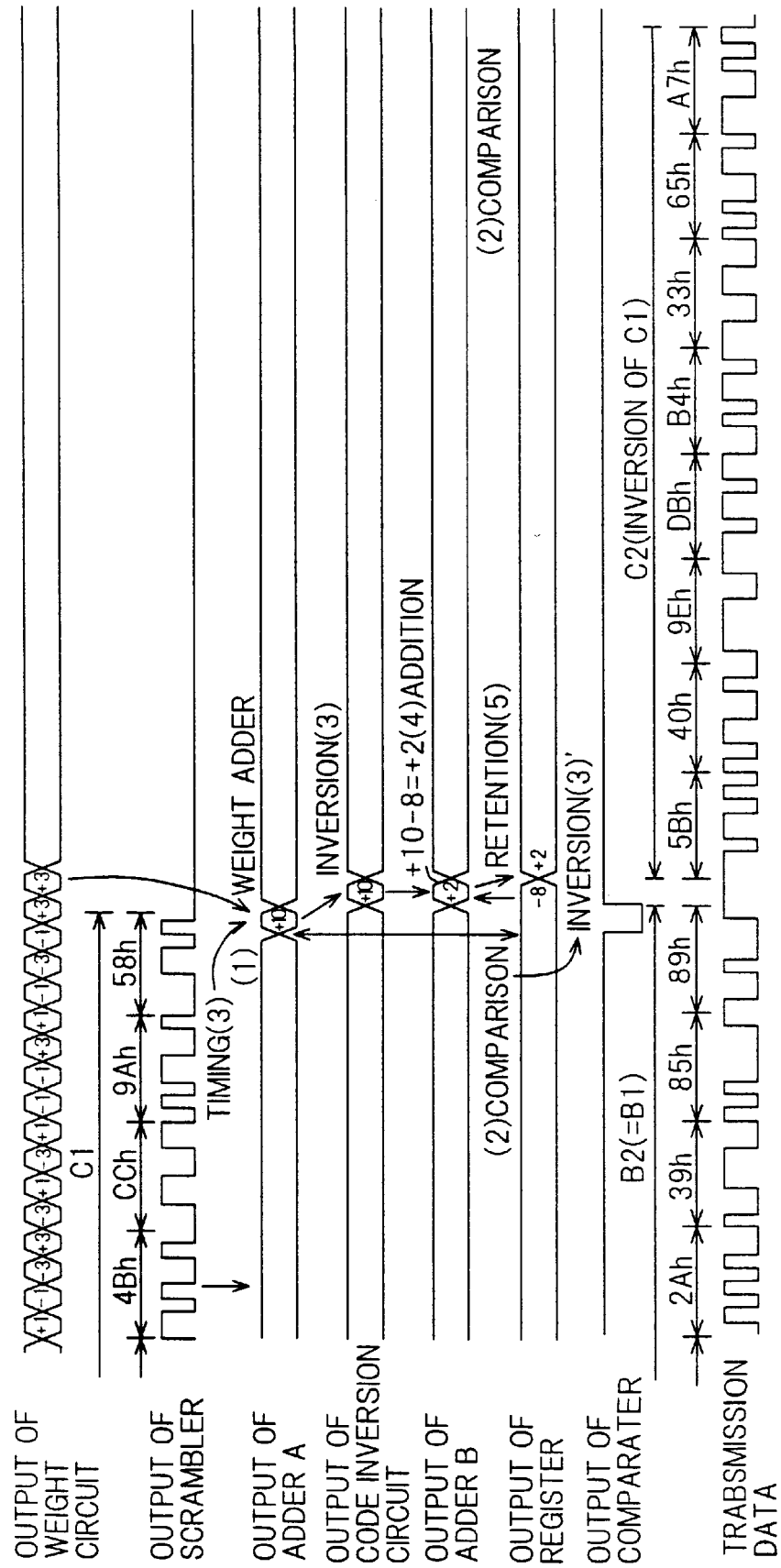
FIG. 4 is a timing chart to follow that in FIG. 3.

On the other hand, in the conventional data processing equipment in FIG. 2, the adder B is also composed of a well-known circuit, which adds first 8-bit data to second 8-bit data and then outputs 8-bit addition result to the data output terminal. Its circuit size is about 50 gates.

The adder A is also composed of a well-known circuit, which takes out by every 2 bits from the input of 64-bit data terminal, calculating 32 weight values, summing up all the weight values, outputting 8-bit data to the output terminal. The weight is of four kinds of values, +3, +1, −1 and −3. The circuit size of the adder A is about 1300 gates.

Here, the circuit size in the embodiment will be compared with that in the conventional equipment, especially as to different blocks from the conventional circuit. As shown in FIG. 5, in the embodiment, a pair of the shift registers, bit stuff circuits and bit inversion circuits are included. However, the size of a pair of the circuit blocks in the embodiment is substantially equal to that of the corresponding circuit block in FOG. 2. Therefore, these circuit blocks are not subject to the comparison. For example, as to shift register, the n/2-bit shift registers are used in the embodiment in FIG. 5 and the n-bit shift register is used in FIG. 2. However, both have the same circuit size as the 64-bit shift register is used in FIG. 2 while the two 32-bit shift registers are used in FIG. 5.

The conventional data processing equipment in FIG. 2 includes further the adder A, adder B and register. As to the register, the circuit size is about 48 gates as the register has to be a 8-bit register and about 6 gates are needed per 1-bit. Accordingly, the total circuit size is 1300+50+48=1398 gates. On the contrary, in the embodiment, the circuit size of the counters A, B is 92+92=184 gates. Thus, the circuit size (gate number) can be reduced to about 1/7.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A data processing equipment for conducting the whitener encoding to suppress DC bias in transmit data in a communication device, comprising:

a parallel-to-serial converter for converting parallel transmit data into serial transmit data;

a scrambler for generating randomized transmit data supplied from the parallel-to-serial converter;

a demultiplexer for distributing the transmit data supplied from the scrambler into a high-order bit and a low-order bit, where said transmit data to be supplied from said demultiplexer are sectioned by an arbitrary bit number n;

a first counter which counts by +(2m+1) when 2-bit symbol data in a data section have a logical level of '10', counts by +(2m−1) when said 2-bit symbol data have a logical level of '11', counts by −(2m−1) when said 2-bit symbol data have a logical level of '01' and counts by −(2m+1) when said 2-bit symbol data have a logical level of '00', where m is an integer to satisfy m1 and n is an even number to satisfy n≧4;

a second counter which counts by +(2m+1) when said 2-bit symbol data, in all data sections before said data section, have a logical level of '10', counts by +(2m−1) when said 2-bit symbol data have a logical level of '11, counts by −(2m−1) when said 2-bit symbol data have a logical level of '01' and counts by −(2m+1) when said 2-bit symbol data have a logical level of '00', where m is an integer to satisfy m≧1;

means for comparing a sign but of said first counter with a sign bit of said second counter;

two bit-inversion circuits which invert between '1' and '0' the data in said data sectional according to the result of said comparing means;

two n/2-bit shift registers which delay the data in said data section by n-bits; and two bit-stuff circuits which insert two stuff bits to said delayed n-bit data supplied from said two n/2-bit shift registers and output said stuff-bit-inserted n-bit data to said two bit-inversion circuits.

2. A data processing equipment, according to claim 1, wherein:

said randomized transmit data are distributed into high-order bit and low-order bit for every two bits as two-bit symbol data by said demultiplexer, and the high-order bit data line and low-order bit data line are each output through separate transmission lines to individual n/2-bit shift registers, individual bit-stuff circuits and individual bit-inversion circuits in succession.

3. A data processing equipment, according to claim 2, wherein:

said high-order bit and low-order bit have a bit width equal to two bits in said randomized transmit data.

4. A data processing equipment, according to claim 1, wherein:

said comparing means comprises an exclusive-OR circuit which is provided with one input terminal connected with the output of said first counter, the other input terminal connected with the output of said second counter and an output terminal connected with the input terminals of said two bit-inversion circuits.

5. A data processing equipment, according to claim 1, wherein:

said comparing means comprises an AND circuit and a first NOR circuit each of which is provided with one input terminal connected with the output of said first counter and the other input terminal connected with the output of said second counter, and a second NOR circuit which is provided with one input terminal connected with the output of said AND circuit, the other input terminal connected with the output of said first NOR circuit and an output terminal connected with the input terminals of said two bit-inversion circuits.

6. A method of conducting the whitener encoding algorithm to adjust the number of '10', '11', '01' and '00' in transmit data so as to suppress DC bias in transmit data, by using a data processing equipment, wherein the data processing equipment comprises:

a parallel-to-serial converter for converting parallel transmit data into serial transmit data; a scrambler for generating randomized transmit data supplied from the parallel-to-serial converter;

a demultiplexer for distributing the transmit data supplied from the scrambler into a high-order bit and a low-order bit, where said transmit data to be supplied from said demultiplexer are sectioned by an arbitrary bit number n;

a first counter which counts by $+(2m+1)$ when 2-bit symbol data in a data section have a logical level of '10', counts by $+(2m-1)$ when said 2-bit symbol data have a logical level of '11', counts by $-(2m-1)$ when said 2-bit symbol data have a logical level of '01' and counts by $-(2m+1)$ when said 2-bit symbol data have a logical level of '00', where m is an integer to satisfy m1 and n is an even number to satisfy $n \geq 4$;

a second counter which counts by $+(2m+1)$ when said 2-bit symbol data, in all data sections before said data section, have a logical level of '10', counts by $+(2m-1)$ when said 2-bit symbol data have a logical level of '11, counts by $-(2m-1)$ when said 2-bit symbol data have a logical level of '01' and counts by $-(2m+1)$ when said 2-bit symbol data have a logical level of '00', where m is an integer to satisfy $m \geq 1$;

means for comparing a sign bit of said first counter with a sign bit of said second counter;

two bit-inversion circuits which invert between '1' and '0' of the data in said data section according to the result of said comparing means;

two n/2-bit shift registers which delay, the data in said data section by n-bits; and two bit-stuff circuits which insert two-bit stuff bit to said delayed n-bit data supplied from said two n/2-bit shift registers and output said stuff-bit-inserted n-bit data to said two bit-inversion circuits, wherein the method comprises the steps of:

transmitting data in said data section after said first counter counts a weight value to said n-bit data section, and after passing the bit number of n-bit data section so as to transmit both the data in said data section and said two n/2-bit shift registers count;

inserting said two-bit stuff bit to said data section by said two bit-stuff circuits so as to be used in the whitener encoding on the receive side;

showing that said weight value of data in said n-bit data section before transmission is on the positive(+) or negative(−) side according to the count result of said first counter;

showing that a weight value of transmitted data is on the positive(+) or negative(−) side according to the count results of said second counter;

judging whether said weight values of said first and second counters are both on the positive(+) or negative (−) side or not by comparing MSB's as sign bits showing signs of said weight values in said first and second counters by said comparing means;

transmitting data in said section counted by said first counter with inverting them by said two bit-inversion circuits so as not to bias said weight value of said transmit data in the same direction as said already transmitted data when judged that said weight values of said first and second counters are both one the positive (+) or negative(−) side, or without inverting them by said two bit-inversion circuits when judged that on of said weight values is on positive(+) side and the other is on the negative(−) side.

* * * * *

UNITED STATES PATENT AND TRADEMARK OFFICE
CERTIFICATE OF CORRECTION

PATENT NO. : 6,236,686 B1
DATED : May 22, 2001
INVENTOR(S) : Y. Kamishima

It is certified that error appears in the above-identified patent and that said Letters Patent is hereby corrected as shown below:

<u>Title page,</u>
Item [56], References Cited, U.S. PATENT DOCUMENTS, delete
"5,644,601    7/1997    Kawaguchi
 6,088,744    12/1999    Kamishima"
OTHER PATENT DOCUMENTS, insert -- Wireless LAN, Draft Standard IEEE 802.11, dated 25 January 1996, pp. 179-180, 183-184 and 189.
Wireless LAN, Draft Standard IEEE 802.11, dated 1 December 1994, pp.226 and 227. --

<u>Column 1,</u>
Line 50, "describe din" should read -- described in --

<u>Column 2,</u>
Line 38, "ever 64- bit" should read -- every 64- bit --

<u>Column 3,</u>
Line 53, "inverted." should read -- inverted, --

<u>Column 4,</u>
Line 35, "levle" shoud read -- level --

Signed and Sealed this

Twenty-second Day of October, 2002

Attest:

*Attesting Officer*

JAMES E. ROGAN
*Director of the United States Patent and Trademark Office*